United States Patent [19]

Nozaki et al.

[11] 4,353,936
[45] Oct. 12, 1982

[54] METHOD OF MANUFACTURING SEMICONDUCTOR DEVICE

[75] Inventors: Takao Nozaki, Aizuwakamatsu; Takashi Ito, Kawasaki, both of Japan

[73] Assignee: Fujitsu Limited, Kanagawa, Japan

[21] Appl. No.: 252,974

[22] PCT Filed: Feb. 27, 1979

[86] PCT No.: PCT/JP79/00046
§ 371 Date: Sep. 5, 1980
§ 102(e) Date: Sep. 5, 1980

[51] Int. Cl.³ .......................... B05D 5/12; B44C 1/22; H01L 21/306
[52] U.S. Cl. ..................... 427/94; 156/646; 156/662; 427/309
[58] Field of Search .................. 156/662, 646; 427/94, 427/309, 399

[56] References Cited

U.S. PATENT DOCUMENTS 3,652,324 3/1972 Chu et al. ............................. 427/94

Primary Examiner—William A. Powell
Attorney, Agent, or Firm—Daniel Jay Tick

[57] ABSTRACT

A silicon nitride film is generated by heating a silicon substrate having an exposed surface in an ambient including ammonia thereby causing the exposed silicon to react with nitrogen atoms. The substrate is heated to a temperature of at least 900° C. in an inert gas, such as argon, whereby the natural oxide film or impurity particles on the surface are subject to vapor etching. The substrate is then heated to a temperature in a range of 900° C. to 1300° C. in the ambient, including ammonia, to produce a dense and homogeneous amorphous silicon nitride film.

5 Claims, 4 Drawing Figures

METHOD OF MANUFACTURING SEMICONDUCTOR DEVICE

BACKGROUND OF THE INVENTION

The present invention relates to a method of manufacturing a semiconductor device. More particularly, the invention relates to a method of forming a stable and dense insulating film of silicon nitride on a silicon surface by a thermal nitriding reaction.

Conventionally, in the manufacture of a semiconductor device, the area on the semiconductor surface in which the junction is exposed is covered with an insulating film in order to suppress the aging variation of the electrical characteristic and to obtain high reliability.

Furthermore, in a field effect transistor, or FET, having a metal insulating film semiconductor, or MIS, structure and an integrated circuit, or IC, a gate insulating film is provided for inducing the inversion layer channel. Stability of the characteristic is therefore particularly required.

Generally, silicon, or Si, has been utilized as the semiconductor substrate, silicon dioxide, or $SiO_2$, has been utilized as the insulating film material and aluminum, or Al, has been utilized as the metal. However, such a structure has the disadvantage that the gate threshold voltage varies considerably when an electric field as high as $10^6$ V/cm is applied to the insulating film at a temperature of about 200° C. This phenomenon appears to occur as a result of a variation of the space charge distribution at the interface, because there are the trapping levels of the carrier due to structural defects of the $SiO_2$ and a drift of impurity ions migrating into the silicon dioxide film. It is obvious that the effect of such variation of the space charge due to the structural defect at the interface of the silicon substrate and the insulating film becomes most distinctive. For this reason, various coating techniques such as, for example, the vapor growth method and sputtering, etc., have been investigated, instead of silicon dioxide film, by thermal oxidation. Thermal oxidation easily permits the mingling of ions such as alkali ions but cannot reduce the defect at the interface more than that of the silicon dioxide film.

On the other hand, a silicon dioxide film produced by thermal oxidation in a very clean ambient maintains a defect of $10^{11}/cm^2$ in terms of the surface charge density, but a defect such as excessive silicon ions etc., remains at the interface. This is a serious problem. Thus, in order to solve the problem of the insulating film formed on the semiconductor surface, a method is proposed for forming a homogeneous amorphous silicon nitride film on the silicon by substantially the thermal nitriding method.

It is a known fact that the nitriding proceeds when the silicon substrate is heated in a nitrogen or ammonia ambient. In accordance with prior experimentation, however, it is considered difficult to obtain homogeneous amorphous silicon nitride, or $Si_3N_4$. The present inventors have discovered the cause to be that when a natural oxide film or impurity particle is adhered to the silicon, the silicon nitride is crystallized, due to such substances considered as a nucleus, and grows, or local nitriding proceeds non-homogeneously.

The principal object of the invention is to provide a method of forming a homogeneous insulating film capable of blocking ionic impurities and having few defects at the interface on the surface of a silicon substrate.

An object of the invention is to provide a thermal nitriding method for producing a homogeneous amorphous silicon nitride film.

Another object of the invention is to provide a thermal nitriding method which includes a method for effectively eliminating a natural oxide film and impurity particles on the surface of a silicon substrate and thereby forming a homogeneous silicon nitride film.

BRIEF SUMMARY OF THE INVENTION

The foregoing objects are realized, in accordance with the invention, by a method of manufacturing a semiconductor device, comprising the steps of heating a silicon substrate in an inert gas ambient and then forming the silicon nitride film by heating the silicon substrate in the ambient including ammonia gas thereby causing the exposed silicon substrate to react with the nitrogen atom.

Prior to the thermal processing in the inert gas, the surface of the silicon substrate is at least partly exposed substantially and the exposed area is desirably cleaned sufficiently by a process using an acid such as, for example, hydrofluoric acid, or HF. Actually, even after sufficient cleaning, there is a natural oxide film having a thickness of several A at the exposed surface of the silicon. Furthermore, even after acidic processing, impurity particles often exist on the exposed surface of the silicon. Thermal treatment in the aforementioned inert gas is effective for vapor etching of the natural oxide film and impurity particles.

Argon or helium is desirable as the aforementioned inert gas, but other inert gases may also be used. The contents of oxygen, or $O_2$, and $H_2O$ of the inert gas should be reduced, and a desirable time and temperature for thermal processing are determined in accordance with such contents. More specifically, the temperature and time of thermal processing and the contents of oxygen and water are determined so that the oxidation rate of the silicon which is substantially exposed on the substrate surface by the oxygen or water contained in the inert gas is lower than the etching speed in the thermal processing in the inert gas. From a practical point of view, it is recommended that the thermal processing temperature be 900° C., or higher.

The thermal processing in the inert gas is effective for vapor etching of the natural oxide film of silicon and impurity particles, but has no etching effect on the insulating film, such as thicker silicon dioxide film. If the surface of the silicon substrate is partly covered with a comparatively thick insulating film such as silicon dioxide, this insulating film is not substantially etched, even during thermal processing in the inert gas. It is a distinctive contrast, when considering that an insulating film such as silicon dioxide may be vapor etched in the thermal processing in the hydrogen gas or in a mixed gas of hydrogen chloride, or HCl and hydrogen. The fact that the insulating film is not desirably etched results in the advantage to the resultant semiconductor device of prevention of short-circuit between the active areas and undesired reduction of the inversion threshold voltage.

After the thermal processing in the inert gas, the silicon substrate is heated in the ambient including ammonia gas, thereby causing the silicon exposed on the silicon substrate surface to react with the nitrogen atoms provided by the ammonia. The silicon nitride film is thus generated. The inert gas may be mixed into the ambient, but pure ammonia gas is substantially recommended. In practice, it is desired that processes be provided for heating the silicon substrate in the heating furnace and changing the inert gas in the furnace to an ambient including ammonia. The contents of oxygen and water of the ambient including ammonia gas should also be reduced, because the nitriding should be superior to the oxidation. It is desirable that the content of oxygen or water also be maintained at 0.01% or less. Since the ammonia gas absorbs humidity, it usually includes considerable amounts of water. However, such oxidative impurities may easily be eliminated by purification means such as molecular sieves. It is desirable that the heating temperature be 900° C. or higher, whereby nitriding should substantially occur. However, it is recommended that a temperature of 1300° C. or higher be avoided, in order to prevent crystallization of the silicon nitride and to obtain homogeneous amorphous film. The thermal nitriding by the ammonia gas results in the production of a silicon nitride film which is more dense and more homogeneous than that obtained by nitrogen gas.

The silicon nitride film thus obtained is very dense in structure and therefore it can function as a diffusion mask in an impurity diffusion process, or as a mask for oxidation in a selective thermal oxidation process for the manufacture of a semiconductor device. Furthermore, this silicon nitride film has fewer structural defects at the interface with the silicon substrate and has an excellent capability of blocking the transmission of ion impurities. Therefore, it is especially suitable for application as the surface protective film of a semiconductor device, the gate insulation film of an MIS FET, and also as a very thin gate insulation film of the non-volatile memory of an MIS structure.

BRIEF DESCRIPTION OF THE DRAWINGS

In order that the invention may be readily carried into effect, it will now be described with reference to the accompanying drawings, wherein.

DETAILED DESCRIPTION OF THE PREFERRED EMBODIMENT OF THE INVENTION

Figure 1:
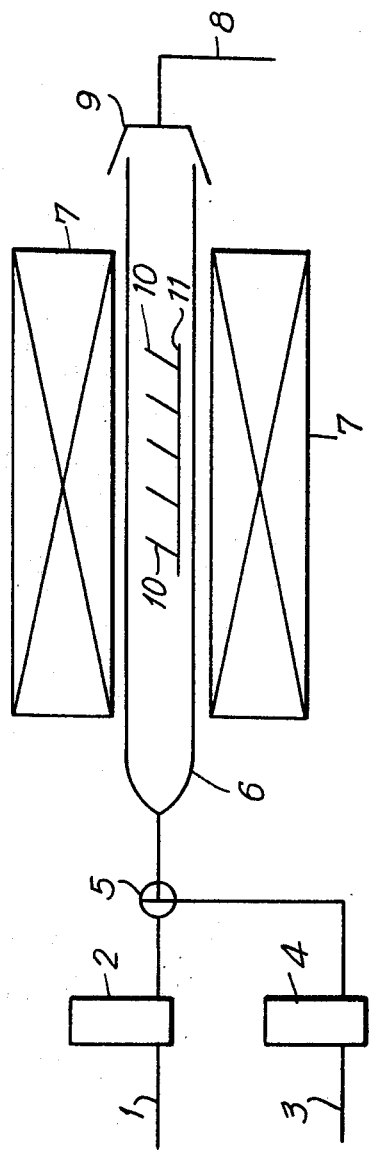
FIG. 1 is a block diagram of an embodiment of apparatus for carrying out the method of the invention.

FIG. 1 is a block diagram of an embodiment of apparatus for carrying out the method of the present invention. An argon, or Ar, gas supply pipe 1 is connected to a valve 5 via a well known refining system 2 comprising molecular sieves. An ammonia, or $NH_3$, supply pipe 3 is also connected to the valve 5 via a refining system 4 similar to the system 2. The output pipe from the valve 5 is connected to a reaction chamber 6 consisting of a quartz tube. A heating furnace 7 is provided for the reaction chamber 6 and heats the inside of said chamber up to a temperature as high as 1000° C., or more. A cap 9 with a gas exhaust pipe 8 is mounted at one end of the chamber 6.

The insulating film such as, for example, a silicon dioxide, or $SiO_2$, film on the surface of the silicon substrate on which thermal nitriding is performed is substantially perfectly eliminated by a well known etching process at least in the area where the silicon nitride is to be formed. Of course, this etching process is unnecessary for a silicon substrate having substantially no insulating film on the surface. The silicon substrate is then dipped into a hydrofluoric acid solution of 48% and the substantially bare surface of said substrate is cleaned.

On the other hand, in the system shown in FIG. 1, the argon gas is supplied to the reaction chamber 6 by the operation of the valve 5 and a zone, heated to a temperature of 1200° C. by the heating furnace 7 is formed in said reaction chamber. The argon gas supplied to the reaction chamber 6 is refined in the refining system 2. That is, the content of oxygen is reduced to 0.1 ppm and the content of water is reduced to 1.5 ppm. When the reaction chamber 6 is substantially fully filled with the argon gas and the zone heated to a temperature of 1200° C. is formed, the cleaned silicon substrate 10 is inserted in said reaction chamber in a manner whereby it is held by a wafer holder 11 and positioned in the 1200° C. temperature zone. Practically, 1 minute to 5 minutes are sufficient as the heating time of the silicon substrate 10 in the argon gas, and the embodiment of FIG. 1, such heating time is selected as 1 minute.

After the lapse of one minute from the insertion of the silicon substrate 10, the gas supplied to the reaction chamber 6 by the operation of the valve 5 is replaced by ammonia. The ammonia gas has a purity of 99.9% and the refining system 4 reduces the content of oxygen and water in the ammonia gas to the order of one ppm. However, no problem arises when the contents of such oxidative impurities are 0.01% or less. The zone where the silicon substrate 10 is positioned is maintained at the temperature of 1200° C. This causes the nitrogen atoms provided by the ammonia at the bare surface of the silicon substrate to react with the silicon, and the silicon nitride film is formed. The relation between the reaction time at the temperature of 1200° C. and the thickness of the produced silicon nitride film is shown by curve 21 in FIG. 2. Curve 22 of FIG. 2 shows a profile of growth of the silicon nitride film when the vapor etching and thermal nitriding are performed in an inert gas ambient.

Figure 2:
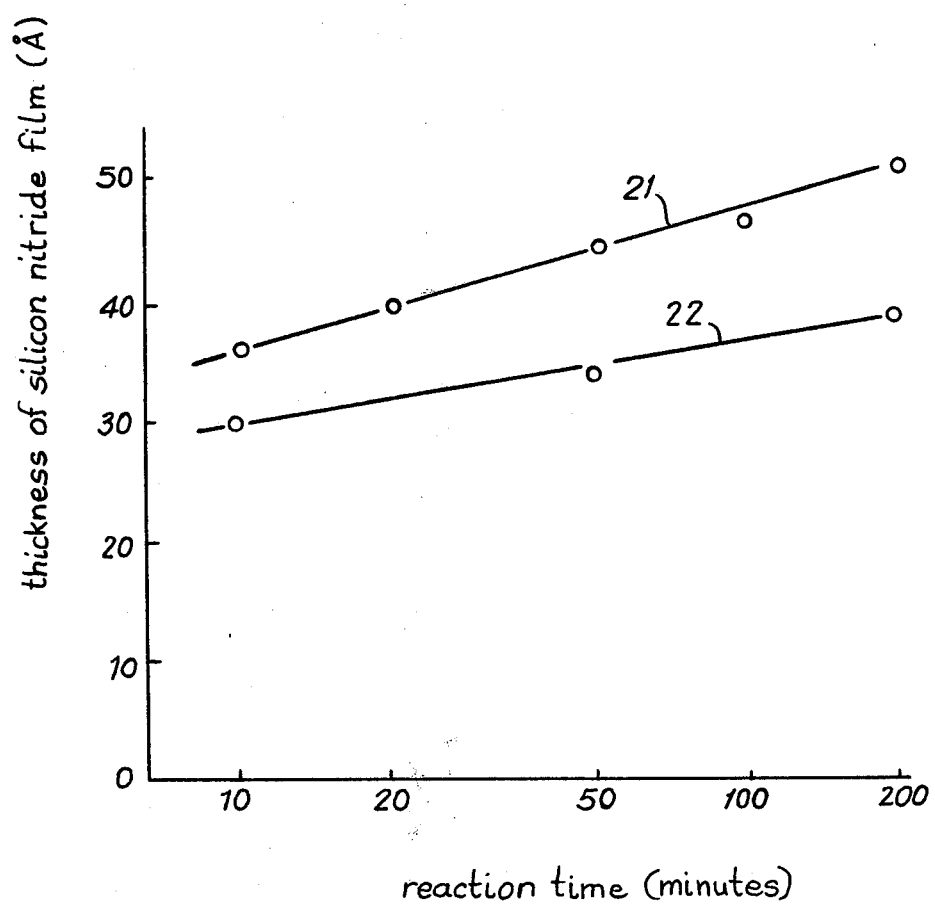
FIG. 2 is a graphical presentation illustrating the relation between the time of thermal processing in the ammonia gas and the thickness of the produced silicon nitride film.

It is observed from FIG. 2 that the silicon nitride film is liable to grow slowly. This tendency may be due to the produced silicon nitride film blocking passing of the nitrogen atoms and thereby controlling the nitriding. As shown in FIG. 2, the fact that a silicon nitride film as thin as several tens Å controls nitriding means that such silicon nitride film is very dense in structure.

Figure 3:
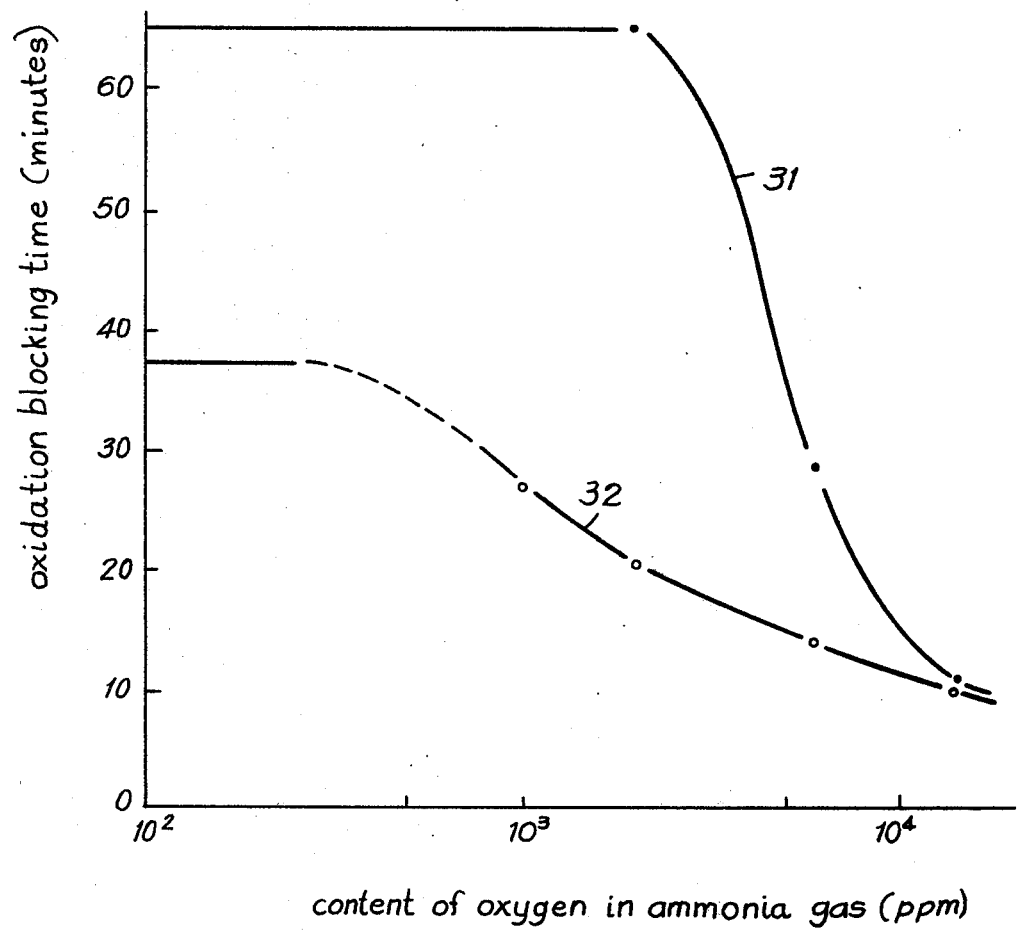
FIG. 3 is a graphical presentation illustrating the relation between the content of oxygen in the ammonia gas for thermal nitriding and the thermal oxidation blocking ability of the produced silicon nitride.

Then, in order to determine the effect of oxidative impurities in the ammonia gas, the silicon nitride film is produced by supplying a mixed gas, obtained by mixing the specified amount of oxygen with the refined ammonia gas, to the reaction chamber. The mixed oxygen gas is presumably transformed into water in the reaction chamber. Silicon nitride has been produced by the same operations and under the same conditions as hereinbefore mentioned, except for mixing of the oxygen. The silicon substrate subjected to sixty minutes of nitriding is then heated to 1000° C. in a wet oxygen ambient. The silicon nitride film interferes with thermal oxidation for a period only according to the thickness and density of said film. However, it cannot thereafter suppress the growth of the silicon dioxide film. The thermal oxidation blocking capability of the silicon nitride film at the silicon substrate surface may therefore be evaluated in terms of the time wherein the thickness of the insulation film at the silicon substrate surface increases rapidly. FIG. 3 is a graphical presentation showing the relation between the mixed amount of oxygen in the ammonia gas and the oxidation blocking period of the produced silicon nitride in the nitriding process. Curve 31 of FIG. 3 shows the oxidation blocking ability of a silicon nitride film produced 1200° C. and curve 32 shows the blocking ability of silicon nitride produced at 1100° C. It is obvious from FIG. 3 that when amount of mixed oxygen at the time of nitriding is 0.01% or less, more specifically 100 ppm or less, there is no deterioration of the oxidation blocking ability of the silicon nitride film and therefore a very dense structure may be obtained.

The effect of the gas ambient on the nitriding is explained for a silicon substrate which has been subjected to five minutes of nitriding at 1250° C. in an ammonia gas ambient, compared with a silicon substrate which has been subjected to five minutes of nitriding at 1250° C. in a nitrogen gas ambient. The operations and conditions other than the nitriding ambient and temperature are the same as those explained with regard to FIG. 1. The Auger electron spectrum for the silicon nitride film on the surfaces of the silicon substrates was measured. The result is shown in FIG. 4.

Figure 4:
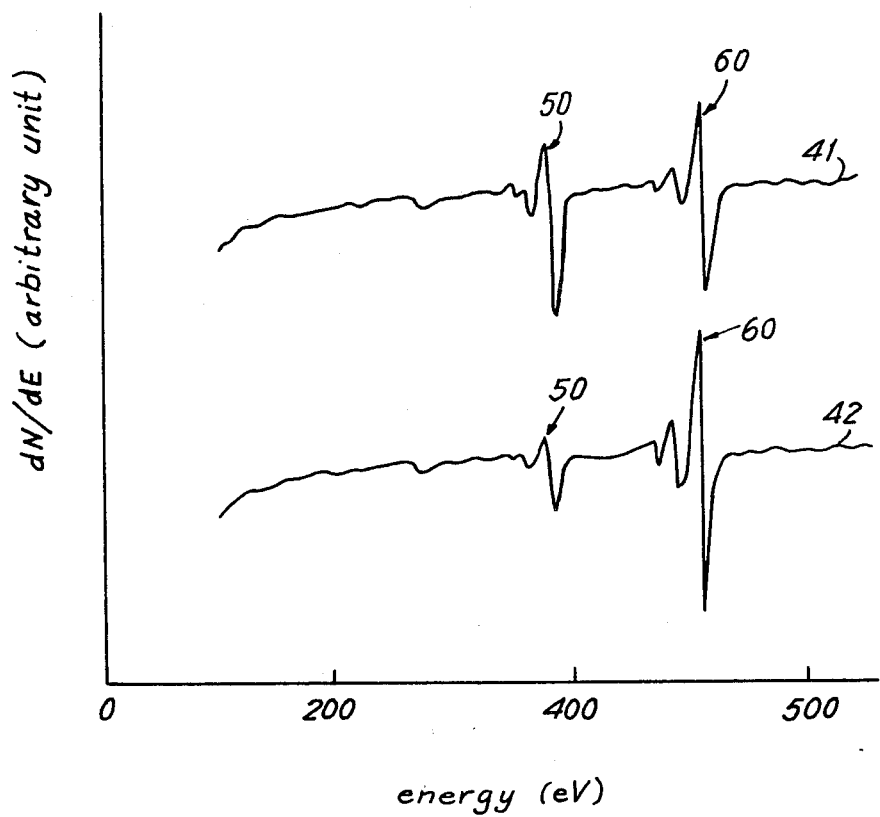
FIG. 4 is a graphical presentation illustrating the Auger electron spectrum obtained from the thermally nitrided silicon substrate surface.

In FIG. 4, a curve 41 and a curve 42 respectively show the Auger electron spectrum of a silicon nitride film produced in an ammonia gas ambient and of a silicon nitride film produced in nitrogen gas. A peak 50 of FIG. 4 corresponds to nitrogen; peak 60 corresponds to oxygen. Therefore, it is obvious that the silicon nitride film produced in an ammonia gas ambient is a nitride which permits less oxide mixture and has a dense structure. This is determined from the fact that the peak value of nitrogen is higher, but the peak value of oxygen is lower than those of the silicon nitride film produced in nitrogen gas.

While the invention has been described by means of a specific example and in a specific embodiment, we do not wish to be limited thereto, for obvious modifications will occur to those skilled in the art without departing from the spirit and scope of the invention.

We claim:

1. A method of manufacturing a semiconductor device in a reaction chamber, said method comprising the steps of preparing a silicon substrate having an exposed surface in the reaction chamber;

initially heating the substrate in said reaction chamber to a temperature sufficient for vapor etching said surface in an inert atmosphere substantially free from oxidative gases; and thereafter heating said substrate to a temperature sufficient for the deposition of a film of silicon nitride on said surface in said reaction chamber in an atmosphere including ammonia and substantially free from other compound gases by direct reaction of nitrogen of said ammonia and silicon of said substrate.

2. A method as claimed in claim 1, wherein said substrate is initially heated to at least 900° C.

3. A method as claimed in claim 1, wherein said inert atmosphere consists of at least one element selected from the group consisting of argon gas and helium gas.

4. A method as claimed in claim 1, wherein oxidative impurities in said atmosphere including ammonia are reduced to a maximum of 0.01%.

5. A method as claimed in claim 1, wherein said substrate is heated in said atmosphere including ammonia to a temperature in a range from 900° C. to 1300° C.

* * * * *